United States Patent
Woo et al.

(10) Patent No.: US 11,335,763 B2
(45) Date of Patent: May 17, 2022

(54) DISPLAY APPARATUS AND METHOD OF MANUFACTURING THE SAME

(71) Applicant: Samsung Display Co., Ltd., Yongin-si (KR)

(72) Inventors: Junhyuk Woo, Yongin-si (KR); Kwangwoo Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 52 days.

(21) Appl. No.: 17/037,991

(22) Filed: Sep. 30, 2020

(65) Prior Publication Data

US 2021/0013295 A1    Jan. 14, 2021

Related U.S. Application Data

(62) Division of application No. 16/357,970, filed on Mar. 19, 2019, now Pat. No. 10,818,743.

(30) Foreign Application Priority Data

Jun. 18, 2018   (KR) .................... 10-2018-0069631

(51) Int. Cl.
*H01L 27/32* (2006.01)
*G02F 1/1362* (2006.01)
*H01L 27/12* (2006.01)

(52) U.S. Cl.
CPC .... *H01L 27/3276* (2013.01); *G02F 1/136286* (2013.01); *H01L 27/124* (2013.01); *H01L 27/1262* (2013.01)

(58) Field of Classification Search
CPC ... H01L 27/32; H01L 27/327; H01L 27/3276; H01L 27/12; H01L 27/124; H01L 27/126;
(Continued)

(56) References Cited

U.S. PATENT DOCUMENTS

| 7,342,354 B2 | 3/2008 | Utsunomiya et al. |
| 9,276,224 B2 | 3/2016 | Yamazaki et al. |

(Continued)

FOREIGN PATENT DOCUMENTS

| JP | 2003-100450 | 4/2003 |
| JP | 2004-349152 | 12/2004 |

(Continued)

*Primary Examiner* — Fazli Erdem
(74) *Attorney, Agent, or Firm* — Kile Park Reed & Houtteman PLLC

(57) ABSTRACT

A method of manufacturing a display device includes preparing a carrier substrate, forming a first substrate layer on the carrier substrate, forming a first, second, and third through holes in the first substrate layer, forming a first intermediate conductive layer having a first exposed portion and a second exposed portion, forming a second intermediate conductive layer having a third exposed portion, forming a second substrate layer on the first substrate layer to cover the first intermediate conductive layer and the second intermediate conductive layer, forming a fourth through hole in the second substrate layer, forming a wiring on the second substrate layer, separating the first substrate layer from the carrier substrate, arranging a first electronic device on a surface of the first substrate layer, and arranging a second electronic device on the surface of the first substrate layer.

6 Claims, 13 Drawing Sheets

(58) Field of Classification Search
CPC . H01L 27/1262; H01L 51/003; G02F 1/1362;
G02F 1/136227; G02F 1/136286
USPC .......................................................... 257/40
See application file for complete search history.

(56) References Cited

U.S. PATENT DOCUMENTS

| | | |
|---|---|---|
| 9,341,873 B2 | 5/2016 | Chen et al. |
| 2014/0008668 A1 | 1/2014 | Hirakata |
| 2015/0372065 A1 | 12/2015 | Yamazaki |
| 2018/0062090 A1 | 3/2018 | Kim et al. |
| 2018/0247994 A1 | 8/2018 | Seo et al. |

FOREIGN PATENT DOCUMENTS

| | | |
|---|---|---|
| JP | 2016-27388 | 2/2016 |
| KR | 10-2017-0133573 | 12/2017 |

DISPLAY APPARATUS AND METHOD OF MANUFACTURING THE SAME

CROSS-REFERENCE TO RELATED APPLICATION

This is a divisional application based on currently pending U.S. patent application Ser. No. 16/357,970, filed on Mar. 19, 2019, the disclosure of which is incorporated herein by reference in its entirety. U.S. patent application Ser. No. 16/357,970 claims priority benefit of Korean Patent Application No. 10-2018-0069631, filed on Jun. 18, 2018 in the Korean Intellectual Property Office, the disclosure of which is incorporated herein by reference in its entirety for all purposes.

BACKGROUND

1. Field

One or more embodiments relate to a display device and a method of manufacturing the same, and more particularly, to a display device having a reduced dead space and for which a manufacturing process is simplified, and a method of manufacturing the display device.

2. Description of the Related Art

In general, a display device applies an electrical signal to a display unit so that an intended image is implemented in the display unit. To this end, the display device includes a component for preparing and/or transmitting an electrical signal to be applied to the display unit.

SUMMARY

Embodiments are directed to a display device, including: a first substrate layer having a first through hole, a second through hole, and a third through hole, which are sequentially arranged and spaced apart from each other; a second substrate layer above the first substrate layer and having a fourth through hole; a first intermediate conductive layer having a first exposed portion between the first substrate layer and the second substrate layer and exposed to the outside of the first substrate layer through the first through hole, and a second exposed portion exposed to the outside of the first substrate layer through the second through hole; a second intermediate conductive layer having a third exposed portion between the first substrate layer and the second substrate layer, spaced apart from the first intermediate conductive layer, and exposed to the outside of the first substrate layer through the third through hole; a wiring on a surface of the second substrate layer in a direction opposite the first substrate layer and electrically connected to the second intermediate conductive layer through the fourth through hole; a first electronic device on a surface of the first substrate layer in a direction opposite the second substrate layer and electrically connected to the first exposed portion; and a second electronic device on a surface of the first substrate layer in a direction opposite the second substrate layer and electrically connected to the second exposed portion and the third exposed portion.

The display device may further include: a barrier layer between the first substrate layer and the second substrate layer, wherein the barrier layer has a fifth through hole to a seventh through hole respectively corresponding to the first through hole to the third through hole, the first intermediate conductive layer and the second intermediate conductive layer are between the barrier layer and the second substrate layer, the first exposed portion is exposed to the outside of the first substrate layer through the fifth through hole and the first through hole, the second exposed portion is exposed to the outside of the first substrate layer through the sixth through hole and the second through hole, and the third exposed portion is exposed to the outside of the first substrate layer through the seventh through hole and the third through hole.

A thickness of the second intermediate conductive layer at a center of the fourth through hole may be less than a thickness of the first intermediate conductive layer.

The display device may further include: a barrier layer between the first substrate layer and the second substrate layer, wherein the barrier layer may have an eighth through hole corresponding to the fourth through hole, the first intermediate conductive layer and the second intermediate conductive layer may be between the barrier layer and the first substrate layer, and the wiring may be electrically connected to the second intermediate conductive layer through the fourth through hole and the eighth through hole.

A thickness of the second intermediate conductive layer at a center of the fourth through hole and the eighth through hole may be less than a thickness of the first intermediate conductive layer. The barrier layer may fill at least a portion of each of the first through hole to the third through hole.

The third through hole among the first through hole to the third through hole may be closest to an edge of the first substrate layer.

A distance between the first through hole and the second through hole may be longer than a distance between the second through hole and the third through hole.

Embodiments are also directed to a display device, including: a first substrate layer having a first through hole and a second through hole arranged to be spaced apart from each other; a second substrate layer above the first substrate layer and having a fourth through hole; a first intermediate conductive layer having a first exposed portion between the first substrate layer and the second substrate layer and exposed to the outside of the first substrate layer through the first through hole, and a second exposed portion exposed to the outside of the first substrate layer through the second through hole; a second intermediate conductive layer having a third exposed portion between the first substrate layer and the second substrate layer, spaced apart from the first intermediate conductive layer, and exposed to the outside of the first substrate layer through the second through hole; a wiring on a surface of the second substrate layer in a direction opposite the first substrate layer and electrically connected to the second intermediate conductive layer through the fourth through hole; a first electronic device on a surface of the first substrate layer in a direction opposite the second substrate layer and electrically connected to the first exposed portion; and a second electronic device on a surface of the first substrate layer in a direction opposite the second substrate layer and electrically connected to the second exposed portion and the third exposed portion.

The display device may further include: a barrier layer between the first substrate layer and the second substrate layer, wherein the barrier layer may have a fifth through hole and a sixth through hole respectively corresponding to the first through hole and the second through hole, the first intermediate conductive layer and the second intermediate conductive layer may be between the barrier layer and the second substrate layer, the first exposed portion may be exposed to the outside of the first substrate layer through the fifth through hole and the first through hole, the second exposed portion may be exposed to the outside of the first substrate layer through the sixth through hole and the second through hole, and the third exposed portion may be exposed to the outside of the first substrate layer through the sixth through hole and the second through hole.

A thickness of the second intermediate conductive layer at a center of the fourth through hole may be less than a thickness of the first intermediate conductive layer.

The display device may further include: a barrier layer between the first substrate layer and the second substrate layer, wherein the barrier layer has an eighth through hole corresponding to the fourth through hole, the first intermediate conductive layer and the second intermediate conductive layer are between the barrier layer and the first substrate layer, and the wiring is electrically connected to the second intermediate conductive layer through the fourth through hole and the eighth through hole.

A thickness of the second intermediate conductive layer at a center of the fourth through hole and the eighth through hole may be less than a thickness of the first intermediate conductive layer. The barrier layer may fill at least a portion of each of the first through hole and the second through hole.

The second through hole may be closer to an edge of the first substrate layer than the first through hole.

The second electronic device may be electrically connected to the first electronic device through the first intermediate conductive layer. Here, the first electronic device may transmit an electrical signal to be applied to the second electronic device. The first electronic device may include a printed circuit board and the second electronic device may include an integrated circuit.

Embodiments are also directed to a method of manufacturing a display device, the method including: preparing a carrier substrate; forming a first substrate layer on the carrier substrate; forming a first through hole, a second through hole, and a third through hole, which are sequentially arranged and spaced apart from each other, in the first substrate layer; forming a first intermediate conductive layer having a first exposed portion exposed to the outside of a first substrate layer through a first through hole and a second exposed portion exposed to the outside of a first substrate layer through a second through hole, and a second intermediate conductive layer that is spaced apart from the first intermediate conductive layer and has a third exposed portion exposed to the outside of the first substrate layer through the third through hole, above the first substrate layer; forming a second substrate layer on the first substrate layer to cover the first intermediate conductive layer and the second intermediate conductive layer; forming a fourth through hole in the second substrate layer such that a portion of the second intermediate conductive layer below the second substrate layer is exposed; forming a wiring on the second substrate layer so as to be electrically connected to the second intermediate conductive layer through the fourth through hole; separating the first substrate layer from the carrier substrate; arranging a first electronic device on a surface of the first substrate layer in a direction opposite the second substrate layer so as to be electrically connected to the first exposed portion; and arranging a second electronic device on the surface of the first substrate layer in a direction opposite the second substrate layer so as to be electrically connected to the second exposed portion and the third exposed portion.

Embodiments are also directed to a method of manufacturing a display device, the method including: preparing a carrier substrate; forming a first substrate layer on the carrier substrate; forming a first through hole and a second through hole spaced apart from each other in the first substrate layer; forming a first intermediate conductive layer having a first exposed portion exposed to the outside of a first substrate layer through a first through hole and a second exposed portion exposed to the outside of a first substrate layer through a second through hole, and a second intermediate conductive layer that is spaced apart from the first intermediate conductive layer and has a third exposed portion exposed to the outside of the first substrate layer through the second through hole, above the first substrate layer; forming a second substrate layer on the first substrate layer to cover the first intermediate conductive layer and the second intermediate conductive layer; forming a fourth through hole in the second substrate layer such that a portion of the second intermediate conductive layer below the second substrate layer is exposed; forming a wiring on the second substrate layer so as to be electrically connected to the second intermediate conductive layer through the fourth through hole; separating the first substrate layer from the carrier substrate; arranging a first electronic device on a surface of the first substrate layer in a direction opposite the second substrate layer so as to be electrically connected to the first exposed portion; and arranging a second electronic device on the surface of the first substrate layer in a direction opposite the second substrate layer so as to be electrically connected to the second exposed portion and the third exposed portion.

The method may further include: performing surface treatment on a region of the carrier substrate where the first exposed portion, the second exposed portion, and the third exposed portion are to be located, prior to the forming of the first substrate layer. Here, the surface treatment may include hydrophobic treatment.

BRIEF DESCRIPTION OF THE DRAWINGS

Features will become apparent to those of skill in the art by describing in detail example embodiments with reference to the attached drawings in which.

DETAILED DESCRIPTION

Figure 1:
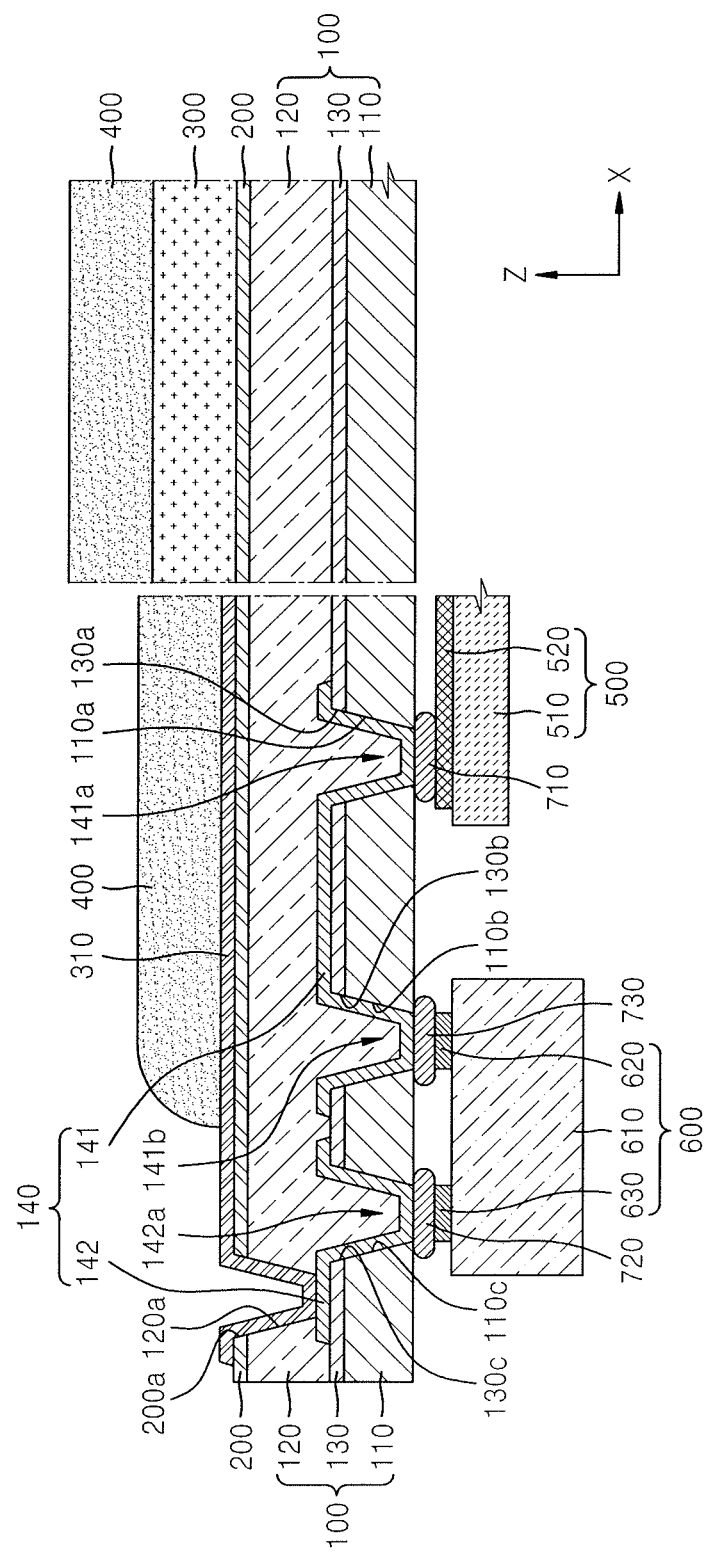
FIG. 1 illustrates a cross-sectional view of a portion of a display device according to an example embodiment.

Example embodiments will now be described more fully hereinafter with reference to the accompanying drawings; however, they may be embodied in different forms and should not be construed as limited to the example embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

As used herein, the term "and/or" includes any and all combinations of one or more of the associated listed items.

It will be understood that when a layer, region, or component is referred to as being "formed on" another layer, region, or component, it can be directly or indirectly formed on the other layer, region, or component. That is, for example, intervening layers, regions, or components may be present. Sizes of components in the drawings may be exaggerated for convenience of explanation. In other words, since sizes and thicknesses of components in the drawings are arbitrarily illustrated for convenience of explanation, the following embodiments are not limited thereto.

Furthermore, an x-axis, a y-axis, and a z-axis are not limited to three axes on an orthogonal coordinate system and may be widely understood. For example, the x-axis, the y-axis, and the z-axis may be perpendicular to one another or may represent different directions that are not perpendicular to one another.

FIG. 1 is a cross-sectional view of a portion of a display device according to an example embodiment.

As shown in FIG. 1, the display device according to the present example embodiment includes a substrate 100, a display unit 300 over the substrate 100, an intermediate conductive layer 140 including a first intermediate conductive layer 141 and a second intermediate conductive layer 142, and a wiring 310. The intermediate conductive layer 140 including the first intermediate conductive layer 141 and the second intermediate conductive layer 142 and the wiring 310 transmit an electrical signal to be applied to the display unit 300.

The substrate 100 may have a multilayer structure as shown in FIG. 1. In more detail, the substrate 100 includes a first substrate layer 110 at a lower portion thereof, a second substrate layer 120 at an upper portion thereof, and a barrier layer 130 interposed therebetween. Each of the first substrate layer 110 and the second substrate layer 120 may include, for example, a polymer resin. For example, the polymer resin may include polyethersulphone (PES), polyacrylate (PAR), polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). The barrier layer 130 may include, for example, silicon oxide, silicon nitride, and/or silicon oxynitride and may have a single layer structure or a multilayer structure.

The first substrate layer 110 may have a first through hole 110a, a second through hole 110b, and a third through hole 110c that are sequentially arranged and spaced apart from each other. FIG. 1 shows that the third through hole 110c among the first through hole 110a, the second through hole 110b, and the third through hole 110c is closest to an edge (a −x direction) of the first substrate layer 110. The second substrate layer 120 above (a +z direction) the first substrate layer 110 also has a through hole, which may be a fourth through hole 120a as shown in FIG. 1. The barrier layer 130 between the first substrate layer 110 and the second substrate layer 120 also has through hole. In more detail, the barrier layer 130 includes a fifth through hole 130a, a sixth through hole 130b, and a seventh through hole 130c corresponding to the first through hole 110a, the second through hole 110b, and the third through hole 110c, respectively.

The first intermediate conductive layer 141 is between the first substrate layer 110 and the second substrate layer 120. In more detail, as shown in FIG. 1, the first intermediate conductive layer 141 is between the barrier layer 130 and the second substrate layer 120. The first intermediate conductive layer 141 has a first exposed portion 141a and a second exposed portion 141b. The first exposed portion 141a of the first intermediate conductive layer 141 refers to a portion of the first intermediate conductive layer 141 that is exposed to the outside (the −z direction) of the first substrate layer 110 through the fifth through hole 130a of the barrier layer 130 and the first through hole 110a of the first substrate layer 110. The second exposed portion 141b of the first intermediate conductive layer 141 refers to a portion of the first intermediate conductive layer 141 that is exposed to the outside (the −z direction) of the first substrate layer 110 through the sixth through hole 130b of the barrier layer 130 and the second through hole 110b of the first substrate layer 110.

Similarly, the second intermediate conductive layer 142 is between the first substrate layer 110 and the second substrate layer 120. In more detail, as shown in FIG. 1, the second intermediate conductive layer 142 is between the barrier layer 130 and the second substrate layer 120. The second intermediate conductive layer 142 has a third exposed portion 142a. The third exposed portion 142a of the second intermediate conductive layer 142 refers to a portion of the second intermediate conductive layer 142 that is exposed to the outside (the −z direction) of the first substrate layer 110 through the seventh through hole 130c of the barrier layer 130 and the third through hole 110c of the first substrate layer 110.

The first intermediate conductive layer 141 and the second intermediate conductive layer 142 may include an identical material and may have an identical layered structure. For example, the first intermediate conductive layer 141 and the second intermediate conductive layer 142 may have a three-layer structure of titanium/aluminum/titanium. In another implementation, the first intermediate conductive layer 141 and the second intermediate conductive layer 142 may include various materials such as metal.

For reference, the first intermediate conductive layer 141 and the second intermediate conductive layer 142 being between the barrier layer 130 and the second substrate layer 120 may be understood in that a portion except for the first exposed portion 141a and the second exposed portion 141b of the first intermediate conductive layer 141 and a portion except for the third exposed portion 142a of the second intermediate conductive layer 142 are between the barrier layer 130 and the second substrate layer 120. That is, since the first exposed portion 141a and the second exposed portion 141b of the first intermediate conductive layer 141 and the third exposed portion 142a of the second intermediate conductive layer 142 are located corresponding to the fifth through hole 130a to the seventh through hole 130c of the barrier layer 130, it can be understood that the first exposed portion 141a and the second exposed portion 141b of the first intermediate conductive layer 141 and the third exposed portion 142a of the second intermediate conductive layer 142 are located at a portion where there is no barrier layer 130.

FIG. 1 shows that the second substrate layer 120 fills at least a portion of each of the first through hole 110a to the third through hole 110c of the first substrate layer 110. In another implementation, when an area (in an xy plane) of each of the first through hole 110a to the third through hole 110c of the first substrate layer 110 is sufficiently narrow, unlike those shown in FIG. 1, each of the first through hole 110a to the third through hole 110c may be filled only with the first intermediate conductive layer 141 or the second intermediate conductive layer 142, and various modifications are possible.

The wiring 310 is above the substrate 100. As shown in FIG. 1, the wiring 310 extends below a surface of the second substrate layer 120 in a direction (a +z direction) opposite the first substrate layer 110 and is electrically connected to the second intermediate conductive layer 142 through the fourth through hole 120a of the second substrate layer 120. Also, as shown in FIG. 1, a buffer layer 200 may be above the substrate 100, and the wiring 310 may be above the buffer layer 200. In this case, the wiring 310 is electrically connected to the second intermediate conductive layer 142 through a through hole 200a of the buffer layer 200 and the fourth through hole 120a of the second substrate layer 120. The buffer layer 200 may planarize a surface of the substrate 100 or prevent impurities from penetrating into a semiconductor layer (not shown) thereon. The buffer layer 200 may include, for example, silicon oxide, silicon nitride, or silicon oxynitride.

The wiring 310 may extend to the display unit 300 and may be electrically connected to a display device such as a thin-film transistor or an organic light-emitting device in the display unit 300. For example, the wiring 310 may include the same material as that of a gate electrode of the thin-film transistor in the display unit 300 and may have the same structure as that of the gate electrode of the thin-film transistor, and the wiring 310 may include the same material as that of a source electrode or a drain electrode of the thin-film transistor in the display unit 300 and may have the same structure as that of the source electrode or the drain electrode of the thin-film transistor. In the former case, the wiring 310 may have a multilayer structure of, for example, molybdenum/aluminum/molybdenum. In the latter case, the wiring 310 may have a multilayer structure of, for example, titanium/aluminum/titanium.

The display unit 300 includes a display device in addition to a thin-film transistor or a capacitor. When the display device includes an organic light-emitting device or the like, in order to protect the display device from external moisture, oxygen, or the like, an encapsulation layer 400 may cover the display unit 300 as shown in FIG. 1. The encapsulation layer 400 may extend not only to the display unit 300 but also to the outside of the display unit 300. FIG. 1 shows that the encapsulation layer 400 covers a portion of the wiring 310.

The encapsulation layer 400 may have a multilayer structure. In more detail, the encapsulation layer 400 may have a structure in which a first inorganic encapsulation layer, an organic encapsulation layer, and a second inorganic encapsulation layer are sequentially stacked. The first inorganic encapsulation layer and the second inorganic encapsulation layer may include, for example, silicon oxide, silicon nitride, and/or silicon oxynitride. The organic encapsulation layer may include, for example, at least one selected from a group of PET, PEN, PC, PI, PES, polyoxymethylene (POM), PAR, and hexamethyldisiloxane (HMDSO). The second inorganic encapsulation layer extends outside the organic encapsulation layer and contacts the first inorganic encapsulation layer, thereby preventing the organic encapsulation layer from being exposed to the outside.

As described above, the encapsulation layer 400 includes the first inorganic encapsulation layer, the organic encapsulation layer, and the second inorganic encapsulation layer. Accordingly, even if cracks occur in the encapsulation layer 400 through such a multilayer structure, it may be possible to prevent such cracks from being connected between the first inorganic encapsulation layer and the organic encapsulation layer or between the organic encapsulation layer and the second inorganic encapsulation layer. In this manner, the formation of a penetration path of external moisture or oxygen into the display unit 300 may be prevented or minimized.

The display device may include a first electronic device 500 and a second electronic device 600 as shown in FIG. 1. An electrical signal to be applied to the display unit 300 may be transmitted from the first electronic device 500 and the second electronic device 600 to the display unit 300. The first intermediate conductive layer 141, the second intermediate conductive layer 142, and/or the wiring 310 may transmit the electrical signal from the first electronic device 500 and/or the second electronic device 600 to the display unit 300.

The first electronic device 500 is below a surface of the first substrate layer 110 in a direction (the −z direction) opposite the second substrate layer 120. The first electronic device 500 is electrically connected to the first exposed portion 141a of the first intermediate conductive layer 141. The first electronic device 500 may include a printed circuit board as shown in FIG. 1. In this case, the first electronic device 500, which includes a printed circuit board, may include a body 510 and a pad 520. The pad 520 may be electrically connected to the first exposed portion 141a of the first intermediate conductive layer 141 through a conductive first adhesive layer 710, such as an anisotropic conductive film.

The second electronic device 600 is also below a surface of the first substrate layer 110 in a direction (the −z direction) opposite the second substrate layer 120. The second electronic device 600 is electrically connected to the second exposed portion 141b of the first intermediate conductive layer 141 and the third exposed portion 142a of the second intermediate conductive layer 142. The second electronic device 600 may include a driving chip such as an integrated circuit as shown in FIG. 1. In this case, the second electronic device 600, which includes a driving chip, may include a body 610 and an input pad 620. The pad 520 may be electrically connected to the second exposed portion 141b of the first intermediate conductive layer 141 through a conductive second adhesive layer 730, such as an anisotropic conductive film, and the output pad 630 may be electrically connected to the third exposed portion 142a of the second intermediate conductive layer 142 through a conductive third adhesive layer 720 such as an anisotropic conductive film.

When the conductive first adhesive layer 710, the conductive second adhesive layer 730, and the conductive third adhesive layer 720 are all anisotropic conductive films, they may be integral. Even if they are integral, the pad 520, the input pad 620, and the output pad 630 may not be directly electrically connected to each other but instead may be electrically connected only to corresponding one of the first exposed portion 141a, the second exposed portion 141b, and the third exposed portion 142a.

Through such a structure, the first electronic device 500 including a printed circuit board may be electrically connected to the second electronic device 600 including an integrated circuit by the first intermediate conductive layer 141, and the second electronic device 600 and the display unit 300 are electrically connected to the second intermediate conductive layer 142 by the wiring 310. The first electronic device 500 such as a printed circuit board transmits an electrical signal to be applied to the second electronic device 600 such as an integrated circuit so that the electrical signal is applied to the display unit 300 through the second electronic device 600 and an intended image may be realized in the display unit 300.

In the display device according to the present example embodiment, the first electronic device 500 and the second electronic device 600 are located in an opposite direction (the −z direction) to a direction in which the display unit 300 of the substrate 100 is located. Accordingly, it may be possible to significantly reduce an area of a peripheral area outside the display unit 300, that is, a dead space. Also, the first electronic device 500 such as a printed circuit board and the second electronic device 600 such as an integrated circuit are electrically connected to each other by the first intermediate conductive layer 141, and the second electronic device 600 and the display unit 300 are electrically connected to the second intermediate conductive layer 142 by the wiring 310 so that the first electronic device 500 such as a printed circuit board and the second electronic devices 600 such as an integrated circuit may be effectively and electronically connected to each other.

A distance between the first through hole 110a and the second through hole 110b may be longer than a distance between the second through hole 110b and the third through hole 110c as shown in FIG. 1. The distance between the first through hole 110a and the second through hole 110b can be understood as a distance between a center of the first through hole 110a and a center of the second through hole 110b. As described above, the second through hole 110b corresponds to the input pad 620 of the second electronic device 600 and the third through hole 110c corresponds to the output pad 630 of the second electronic device 600. The first through hole 110a corresponds to the pad 520 of the first electronic device 500 and not a portion of the second electronic device 600. In this situation, the distance between the second through hole 110b and the third through hole 110c may be related to a size of the second electronic device 600, while the distance between the first through hole 110a and the second through hole 110c may be varied. Therefore, as the distance between the first through hole 110a and the second through hole 110b becomes longer than the distance between the second through hole 110b and the third through hole 110c, physical interference between the first electronic device 500 and the second electronic device 600 may be avoided when the first electronic device 500 and the second electronic device 600 are attached to the substrate 100 and the process of attaching the first electronic device 500 and the second electronic device 600 to the substrate 100 may be facilitated.

FIGS. 2 to 7 are cross-sectional views of processes of manufacturing the display device of FIG. 1.

Figure 2:
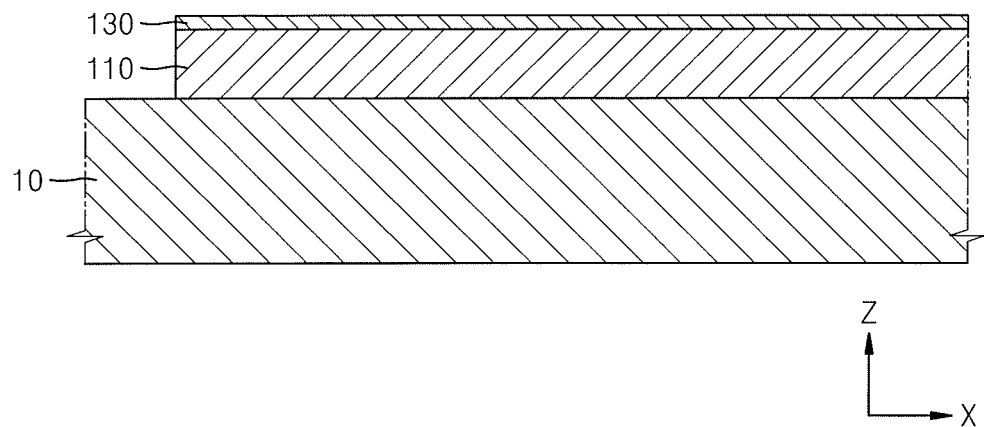
FIGS. 2 to 7 illustrate cross-sectional views of processes of manufacturing the display device of FIG. 1.

As shown in FIG. 2, a carrier substrate 10 such as glass having a sufficient thickness is prepared and the first substrate layer 110 and the barrier layer 130 are formed on the carrier substrate 10. The first substrate layer 110 may be formed by applying a material for forming a polymer resin as described above on the carrier substrate 10 and curing the material. The barrier layer 130 may be formed by placing an inorganic material as described above on the first substrate layer 110 by deposition or the like.

Figure 3:
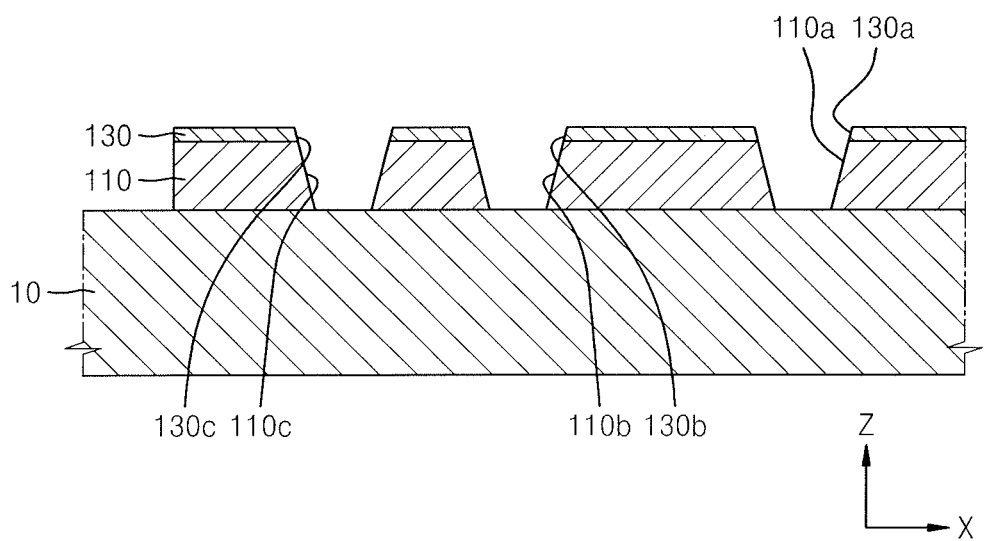

Next, as shown in FIG. 3, the first through hole 110a, the second through hole 110b, and the third through hole 110c, which are sequentially arranged and spaced apart from each other, are formed in the first substrate layer 110. Since the barrier layer 130 is formed on the first substrate layer 110, the fifth through hole 130a, the sixth through hole 130b, and the seventh through hole 130c of the barrier layer 130 are simultaneously formed when the first through hole 110a, the second through hole 110b, and the third through hole 110c are formed in the first substrate layer 110. This process may be performed by applying a photoresist on the barrier layer 130, removing the photoresist only at a portion where the first through hole 110a, the second through hole 110b, and the third through hole 110c are to be formed, and simultaneously etching the barrier layer 130 and the first substrate layer 110 by etching the portion of the barrier layer 130 not covered with the photoresist with an etchant. Accordingly, as shown in FIG. 3, an inner surface of the first through hole 110a and an inner surface of the fifth through hole 130a may form a continuous surface, an inner surface of the second through hole 110b and an inner surface of the sixth through hole 130b may form a continuous surface, and an inner surface of the third through hole 110c and an inner surface of the seventh through hole 130c may form a continuous surface.

Figure 4:
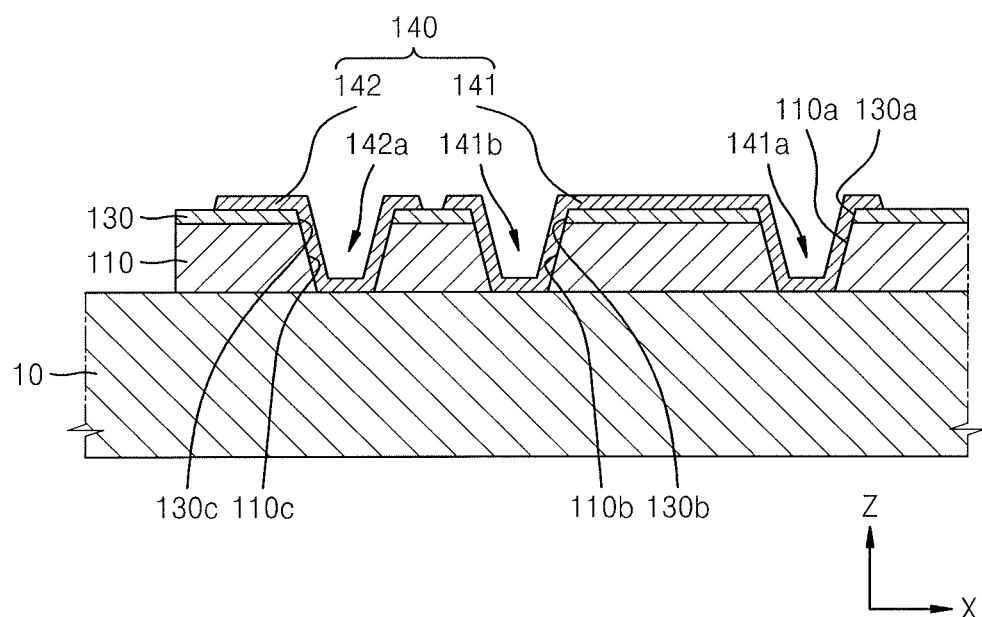

Then, referring to FIG. 4, a conductive layer is coated on the barrier layer 130 and patterned to simultaneously form the first intermediate conductive layer 141 and the second intermediate conductive layer 142, which are spaced apart from each other. The patterning of the conductive layer may also be performed using a photoresist method. The first through hole 110a, the second through hole 110b, and the third through hole 110c are formed in the first substrate layer 110, and the fifth through hole 130a, the sixth through hole 130b, and the seventh through hole 130c are formed in the barrier layer 130. Therefore, the first intermediate conductive layer 141 has the first exposed portion 141a and the second exposed portion 141b which are in contact with the carrier substrate 10 in the first through hole 110a and the second through hole 110b, and the second intermediate conductive layer 142 has the third exposed portion 142a which is in contact with the carrier substrate 10 in the third through hole 110c.

Figure 5:
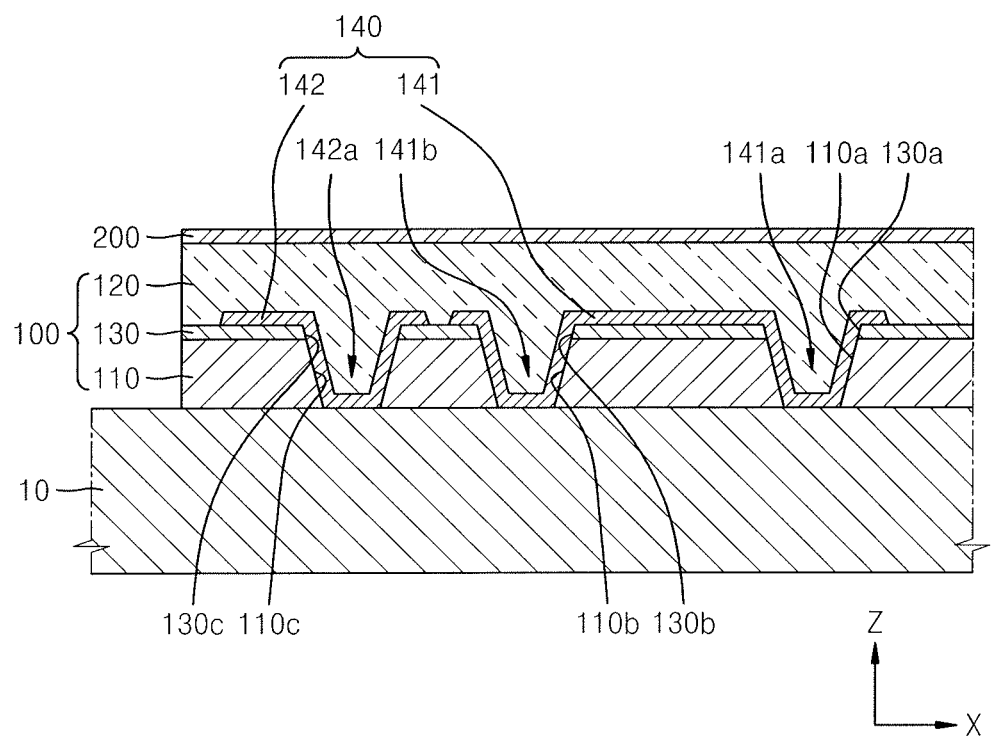

Next, as shown in FIG. 5, the second substrate layer 120 is formed on the first substrate layer 110 so as to cover the first intermediate conductive layer 141 and the second intermediate conductive layer 142. The second substrate layer 120 may formed by applying a material for forming a polymer resin as described above on the carrier substrate 10, that is, on the barrier layer 130, the first intermediate conductive layer 141, and the second intermediate conductive layer 142, and curing the material. The buffer layer 200 may be formed by placing an inorganic material as described above on the second substrate layer 120 by deposition or the like.

Figure 6:
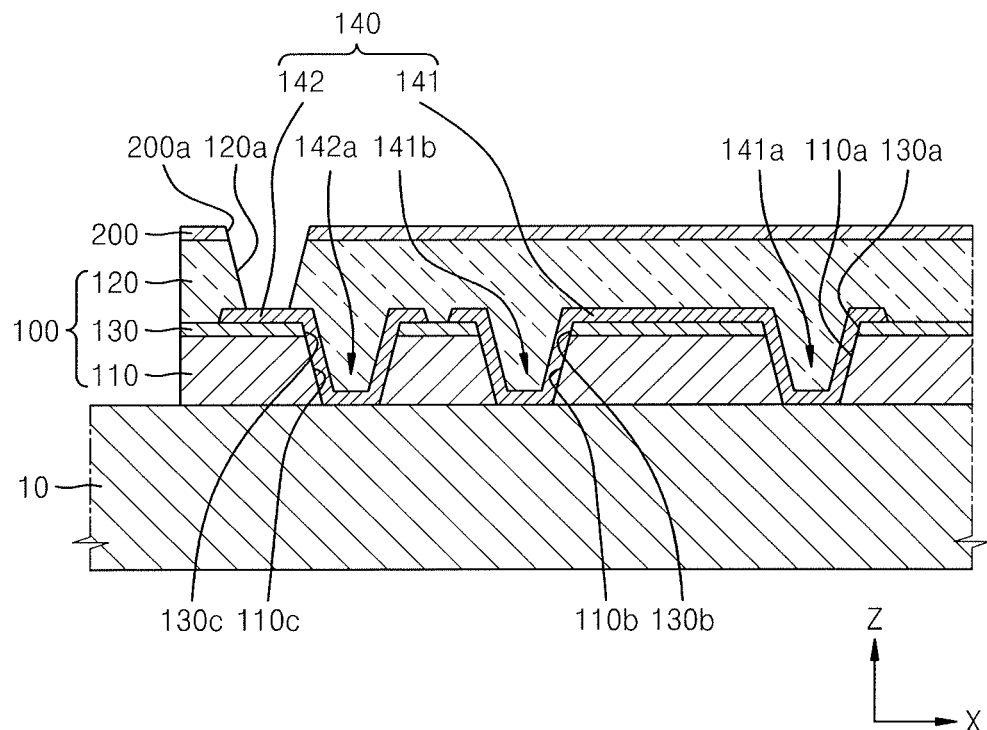

Thereafter, as shown in FIG. 6, the fourth through hole 120a is formed in the second substrate layer 120 such that a portion of the second intermediate conductive layer 142 below the second substrate layer 120 is exposed. Since the buffer layer 200 is formed on the second substrate layer 120, the buffer layer 200 and the second substrate layer 120 are simultaneously patterned to simultaneously form the fourth through hole 120a of the second substrate layer 120 and the through hole 200a of the buffer layer 200. This process may be performed using a photoresist or the like.

Meanwhile, when a portion of the second substrate layer 120 formed of a polymer resin is removed to form the fourth through hole 120a, it may take more time to remove the portion of the second substrate layer 120 by using an etchant or the like than when patterning a general inorganic film due to the nature of a polymer resin. As a result, a portion of an upper surface of the second intermediate conductive layer 142 exposed by the fourth through hole 120a may be removed by an etchant. Therefore, a thickness of the second intermediate conductive layer 142 at a center of the fourth through hole 120a may be less than a thickness of the first intermediate conductive layer 141.

Figure 7:
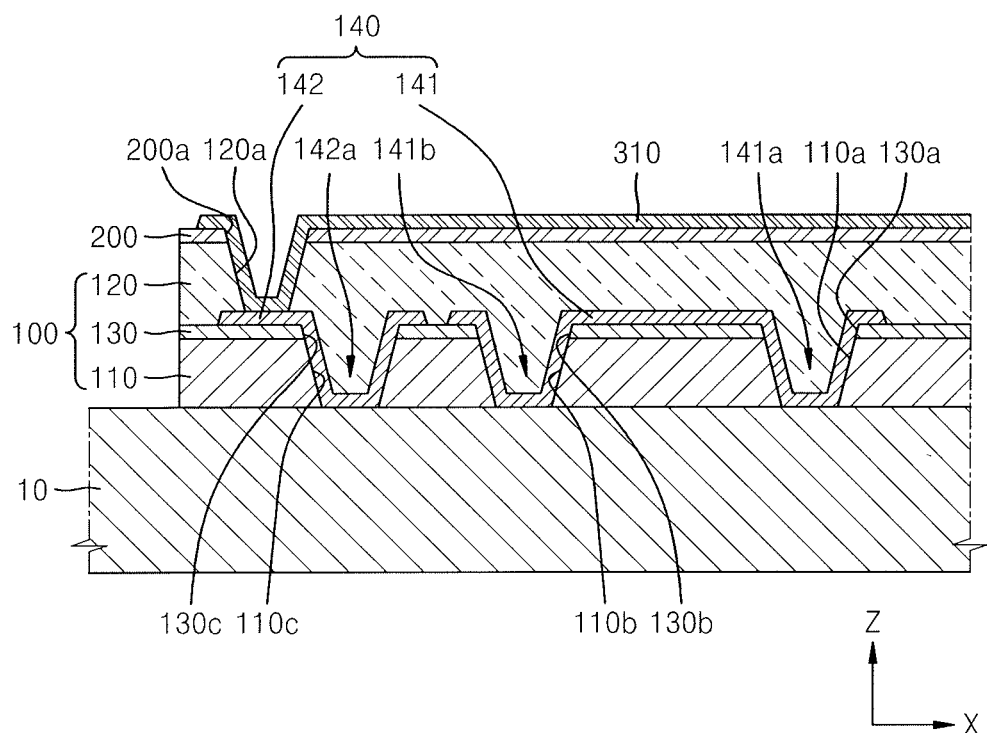

Thereafter, as shown in FIG. 7, a conductive layer is formed on the second substrate layer 120, for example, on the buffer layer 200, and is patterned.

Through the above process, the wiring 310 may be formed so as to be electrically connected to the second intermediate conductive layer 142 through the through hole 200a of the buffer layer 200 and the fourth through hole 120a of the second substrate layer 120. The wiring 310 may be formed at the same time when forming a gate electrode of a thin-film transistor in a display unit by using an identical material, or may be formed at the same time when forming a source electrode or a drain electrode of the thin-film transistor by using an identical material.

The substrate 100 including the first substrate layer 110 may be separated from the carrier substrate 10 after forming a display unit, an encapsulation layer, or the like. Accordingly, the first exposed portion 141a and the second exposed portion 141b of the first intermediate conductive layer 141 and the third exposed portion 142a of the second intermediate conductive layer 142 are exposed to the outside of the first substrate layer 110. The first electronic device 500 (see FIG. 1) is arranged so as to be electrically connected to the first exposed portion 141a below a surface of the first substrate layer 110 in a direction (the −z direction) opposite the second substrate layer 120, and the second electronic device 600 (see FIG. 1) is arranged so as to be electrically connected to the second exposed portion 141b and the third exposed portion 142a, thereby manufacturing a display device as shown in FIG. 1.

When the substrate 100 including the first substrate layer 110 is separated from the carrier substrate 10, the first exposed portion 141a and the second exposed portion 141b of the first intermediate conductive layer 141 and the third exposed portion 142a of the second intermediate conductive layer 142 are separated from the carrier substrate 10. The first intermediate conductive layer 141 and the second intermediate conductive layer 142 should be smoothly separated from the carrier substrate 10 so that the first exposed portion 141a and the second exposed portion 141b of the first intermediate conductive layer 141 and the third exposed portion 142a of the second intermediate conductive layer 142 may be prevented from being damaged.

For this, before forming the first substrate layer 110 on the carrier substrate 10 as shown in FIG. 2, a surface of a region on the carrier substrate 10 on which the first exposed portion 141a, the second exposed portion 141b, and the third exposed portion 142a are to be located may be subjected to a surface treatment. The surface treatment may sufficiently lower bonding force between the first intermediate conductive layer 141 and the carrier substrate 10 and bonding force between the second intermediate conductive layer 142 and the carrier substrate 10, although the first intermediate conductive layer 141 and the second intermediate conductive layer 142 are formed later. Accordingly, when the substrate 100 is separated from the carrier substrate 10 at a later time, the first exposed portion 141a and the second exposed portion 141b of the first intermediate conductive layer 141 and the third exposed portion 142a of the second intermediate conductive layer 142 may be separated from the carrier substrate 10 without being damaged.

As an example of such a surface treatment, a predetermined portion of the carrier substrate 10 may be subjected to hydrophobic treatment using fluorine or the like. This also applies to the following embodiments and variations thereof.

Figure 8:
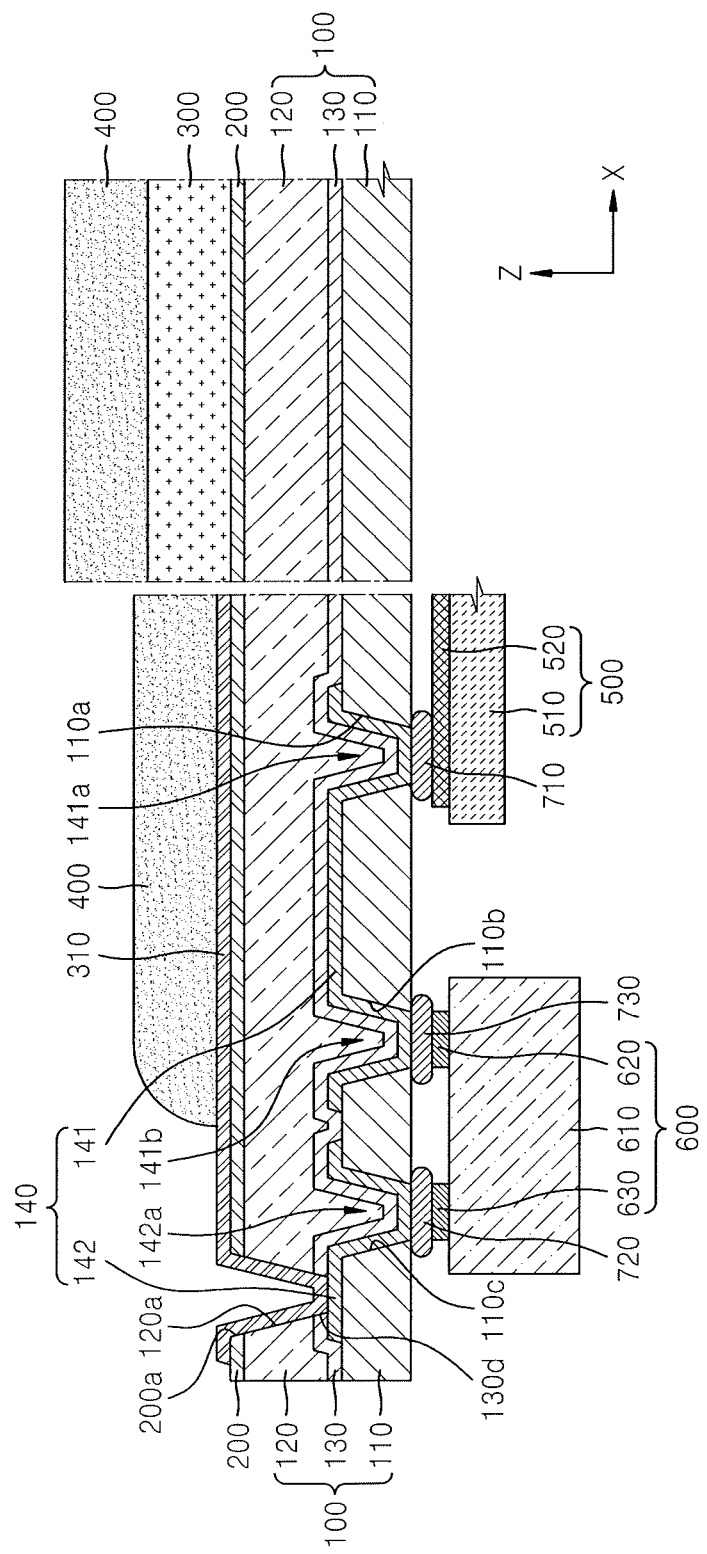
FIG. 8 illustrates a cross-sectional view of a portion of a display device according to another example embodiment.

FIG. 8 is a cross-sectional view of a portion of a display device according to another example embodiment. The display device according to the present example embodiment is different from the display device described above with reference to FIG. 1 in a positional relationship between the intermediate conductive layer 140 such as the first intermediate conductive layer 141 and the second intermediate conductive layer 142 and the barrier layer 130.

In the display device according to the present example embodiment, the first intermediate conductive layer 141 and the second intermediate conductive layer 142 are above the first substrate layer 110. The barrier layer 130 covers the first intermediate conductive layer 141 and the second intermediate conductive layer 142 and is between the first substrate layer 110 and the second substrate layer 120. Unlike the description given above with reference to FIG. 1, the barrier layer 130 does not have the fifth through hole 130a (see FIG. 1) to the seventh through hole 130c (see FIG. 1) and instead has an eighth through hole 130d corresponding to the fourth through hole 120a of the second substrate layer 120. Accordingly, a portion of the second intermediate conductive layer 142 is exposed through the eighth through hole 130d of the barrier layer 130 and the fourth through hole 120a of the second substrate layer 120. The wiring 310 over the second substrate layer 120 may be electrically connected to the second intermediate conductive layer 142 through the fourth through hole 120a and the eighth through hole 130d.

Other configurations of the display device according to the present example embodiment are the same as and/or similar to those described in the above-described embodiment with reference to FIG. 1, and the related content may be applied. The barrier layer 130 covers the first intermediate conductive layer 141 and the second intermediate conductive layer 142 so that the barrier layer 130 fills at least a portion of each of the first through hole 110a to the third through hole 110c of the first substrate layer 110 as shown in FIG. 8. When an area (in the xy plane) of each of the first through hole 110a to the third through hole 110c of the first substrate layer 110 is sufficiently narrow, as compared to those shown in FIG. 8, each of the first through hole 110a to the third through hole 110c may be filled only with the first intermediate conductive layer 141 or the second intermediate conductive layer 142, and various modifications are possible.

FIGS. 9 to 14 are cross-sectional views of processes of manufacturing the display device of FIG. 8.

Figure 9:
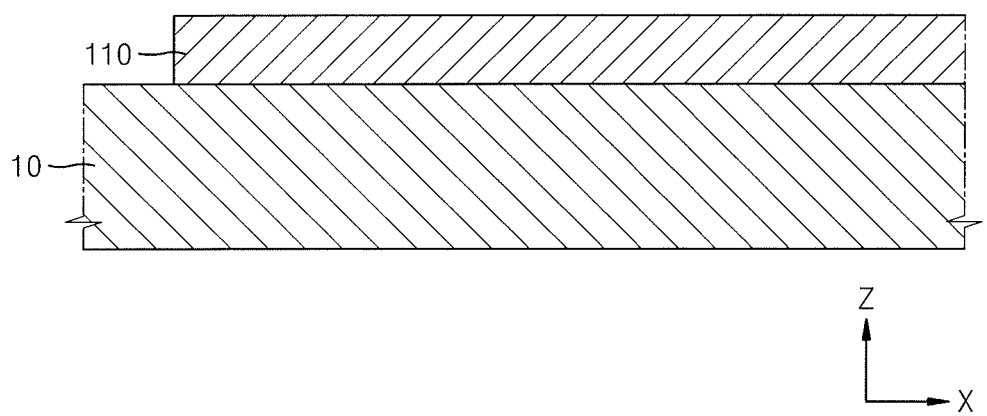
FIGS. 9 to 14 illustrate cross-sectional views of processes of manufacturing the display device of FIG. 8.

As shown in FIG. 9, the carrier substrate 10 such as glass having a sufficient thickness is prepared and the first substrate layer 110 is formed on the carrier substrate 10. The first substrate layer 110 may be formed by applying a material for forming a polymer resin as described above on the carrier substrate 10 and curing the material.

Figure 10:
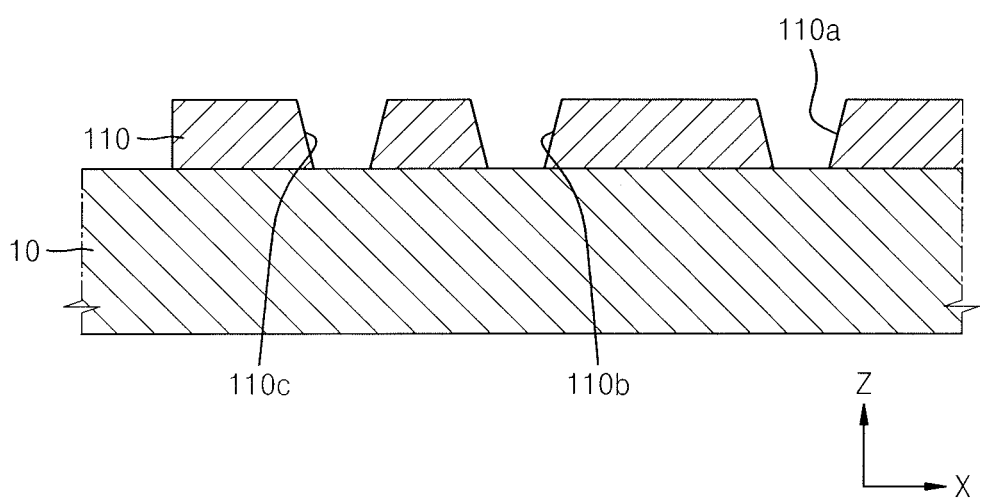

Next, as shown in FIG. 10, the first through hole 110a, the second through hole 110b, and the third through hole 110c, which are sequentially arranged and spaced apart from each other, are formed in the first substrate layer 110. This process may be performed by applying a photoresist on the first substrate layer 110, removing the photoresist only at a portion where the first through hole 110a, the second through hole 110b, and the third through hole 110c are to be formed, and etching the portion of the first substrate layer 110 not covered with the photoresist with an etchant.

Figure 11:
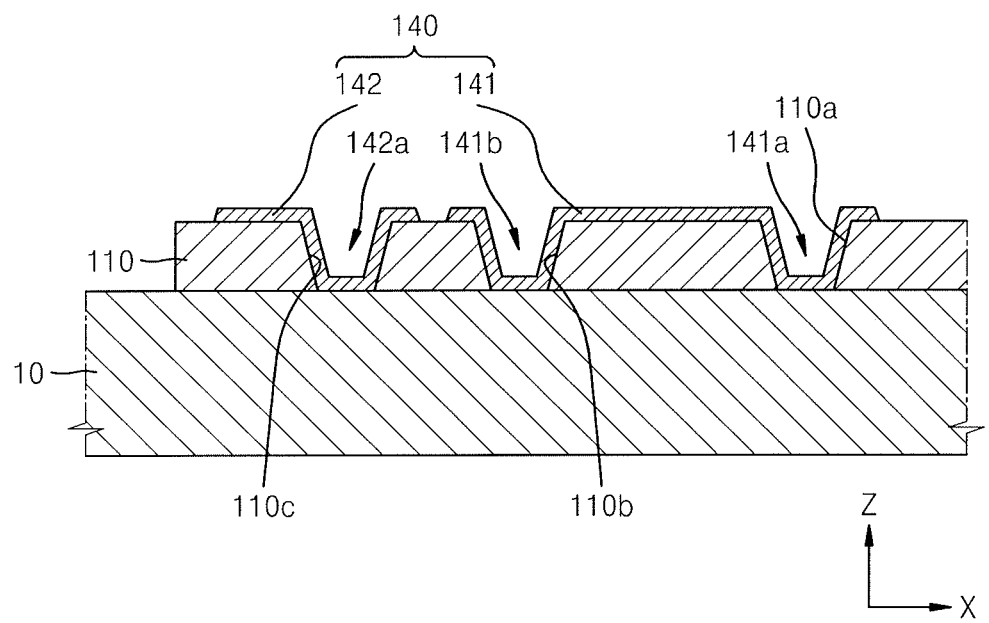

Then, referring to FIG. 11, a conductive layer is coated on the first substrate layer 110 and patterned to simultaneously form the first intermediate conductive layer 141 and the second intermediate conductive layer 142, which are spaced apart from each other. The patterning of the conductive layer may also be performed using a photoresist method. The first through hole 110a, the second through hole 110b, and the third through hole 110c are formed in the first substrate layer 110. Therefore, the first intermediate conductive layer 141 has the first exposed portion 141a and the second exposed portion 141b which are in contact with the carrier substrate 10 in the first through hole 110a and the second through hole 110b, and the second intermediate conductive layer 142 has the third exposed portion 142a which is in contact with the carrier substrate 10 in the third through hole 110c.

Figure 12:
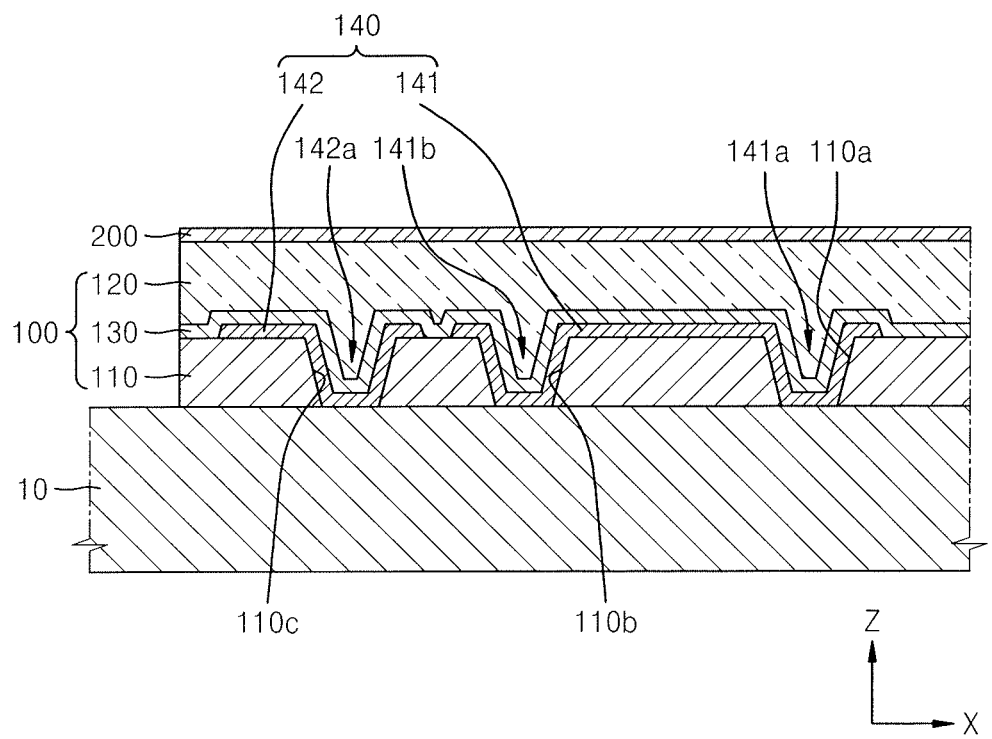

Thereafter, the barrier layer 130 is formed as shown in FIG. 12. That is, the first substrate layer 110 and the barrier layer 130 covering the first intermediate conductive layer 141 and the second intermediate conductive layer 142 may be formed by placing an inorganic material as described above on the first substrate layer 110 by deposition or the like. The second substrate layer 120 is then formed on the first substrate layer 110 to cover the barrier layer 130. The second substrate layer 120 may be formed by applying a material for forming a polymer resin as described above on the first substrate layer 110 and curing the material. The buffer layer 200 may be formed by placing an inorganic material as described above on the second substrate layer 120 by deposition or the like.

Figure 13:
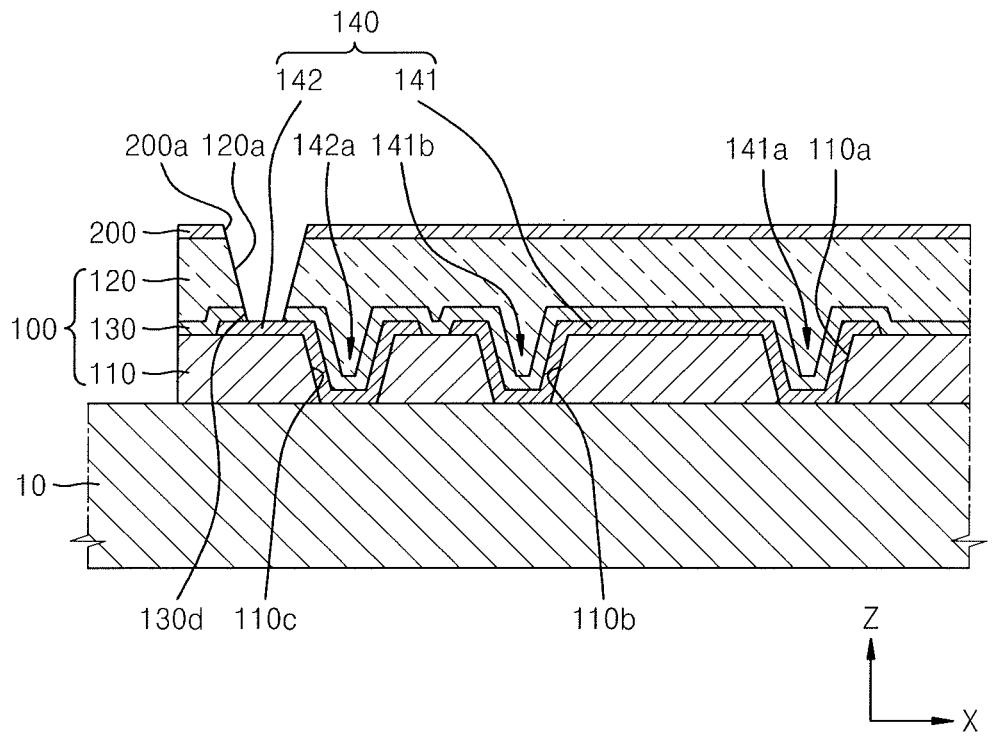

Thereafter, as shown in FIG. 13, the fourth through hole 120a is formed in the second substrate layer 120 such that a portion of the second intermediate conductive layer 142 below the second substrate layer 120 is exposed. Since the barrier layer 130 is above the second intermediate conductive layer 142 and the buffer layer 200 is formed on the second substrate layer 120, the barrier layer 130, the buffer layer 200, and the second substrate layer 120 are simultaneously patterned to simultaneously form the eighth through hole 130d of the barrier layer 130, the fourth through hole 120a of the second substrate layer 120, and the through hole 200a of the buffer layer 200. This process may be performed using a photoresist or the like. Accordingly, as shown in FIG. 13, an inner surface of the eighth through hole 130d, an inner surface of the fourth through hole 120a, and an inner surface of the through hole 200a may form a continuous surface.

Meanwhile, when a portion of the second substrate layer 120 formed of a polymer resin is removed to form the fourth through hole 120a, it may take more time to remove the portion of the second substrate layer 120 by using an etchant or the like than when patterning a conventional inorganic film due to the nature of a polymer resin. As a result, a portion of an upper surface of the second intermediate conductive layer 142 exposed by the fourth through hole 120a may be removed by an etchant. Therefore, a thickness of the second intermediate conductive layer 142 at a center of the fourth through hole 120a and the eighth through hole 130d may be less than the thickness of the first intermediate conductive layer 141.

Figure 14:
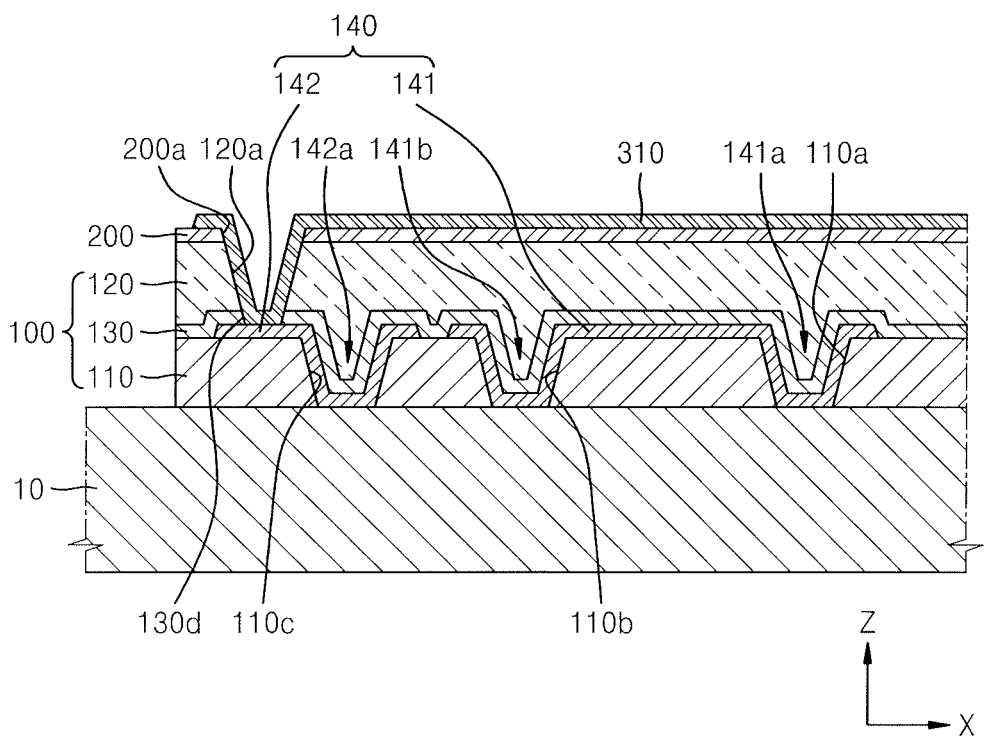

Thereafter, as shown in FIG. 14, a conductive layer is formed on the second substrate layer 120, specifically, on the buffer layer 200, and is patterned. Through the above process, the wiring 310 may be formed so as to be electrically connected to the second intermediate conductive layer 142 through the through hole 200a of the buffer layer 200, the fourth through hole 120a of the second substrate layer 120, and the eighth through hole 130d of the barrier layer 130. The wirings 310 may be formed at the same time when forming a gate electrode of a thin-film transistor in a display unit by using an identical material, or may be formed at the same time when forming a source electrode or a drain electrode of the thin-film transistor by using an identical material.

The substrate 100 including the first substrate layer 110 is separated from the carrier substrate 10 after forming a display unit, an encapsulation layer, or the like. Accordingly, the first exposed portion 141a and the second exposed portion 141b of the first intermediate conductive layer 141 and the third exposed portion 142a of the second intermediate conductive layer 142 are exposed to the outside of the first substrate layer 110. The first electronic device 500 (see FIG. 8) is arranged so as to be electrically connected to the first exposed portion 141a below a surface of the first substrate layer 110 in a direction (the −z direction) opposite the second substrate layer 120, and the second electronic device 600 (see FIG. 8) is arranged so as to be electrically connected to the second exposed portion 141b and the third exposed portion 142a, thereby manufacturing a display device as shown in FIG. 8.

When the substrate 100 including the first substrate layer 110 is separated from the carrier substrate 10, the first exposed portion 141a and the second exposed portion 141b of the first intermediate conductive layer 141 and the third exposed portion 142a of the second intermediate conductive layer 142 are separated from the carrier substrate 10. The first intermediate conductive layer 141 and the second intermediate conductive layer 142 should be smoothly separated from the carrier substrate 10 so that the first exposed portion 141a and the second exposed portion 141b of the first intermediate conductive layer 141 and the third exposed portion 142a of the second intermediate conductive layer 142 may be prevented from being damaged.

For this, before forming the first substrate layer 110 on the carrier substrate 10 as shown in FIG. 9, a surface of a region on the carrier substrate 10 on which the first exposed portion 141a, the second exposed portion 141b, and the third exposed portion 142a are to be located may be subjected to a surface treatment. This surface treatment may sufficiently lower bonding force between the first intermediate conductive layer 141 and the carrier substrate 10 and bonding force between the second intermediate conductive layer 142 and the carrier substrate 10 although the first intermediate conductive layer 141 and the second intermediate conductive layer 142 are formed later. Accordingly, when the substrate 100 is separated from the carrier substrate 10 at a later time, the first exposed portion 141a and the second exposed portion 141b of the first intermediate conductive layer 141 and the third exposed portion 142a of the second intermediate conductive layer 142 may be separated from the carrier substrate 10 without being damaged. As an example of such a surface treatment, a predetermined portion of the carrier substrate 10 may be subjected to hydrophobic treatment using fluorine or the like. This also applies to the following example embodiments and variations thereof.

Figure 15:
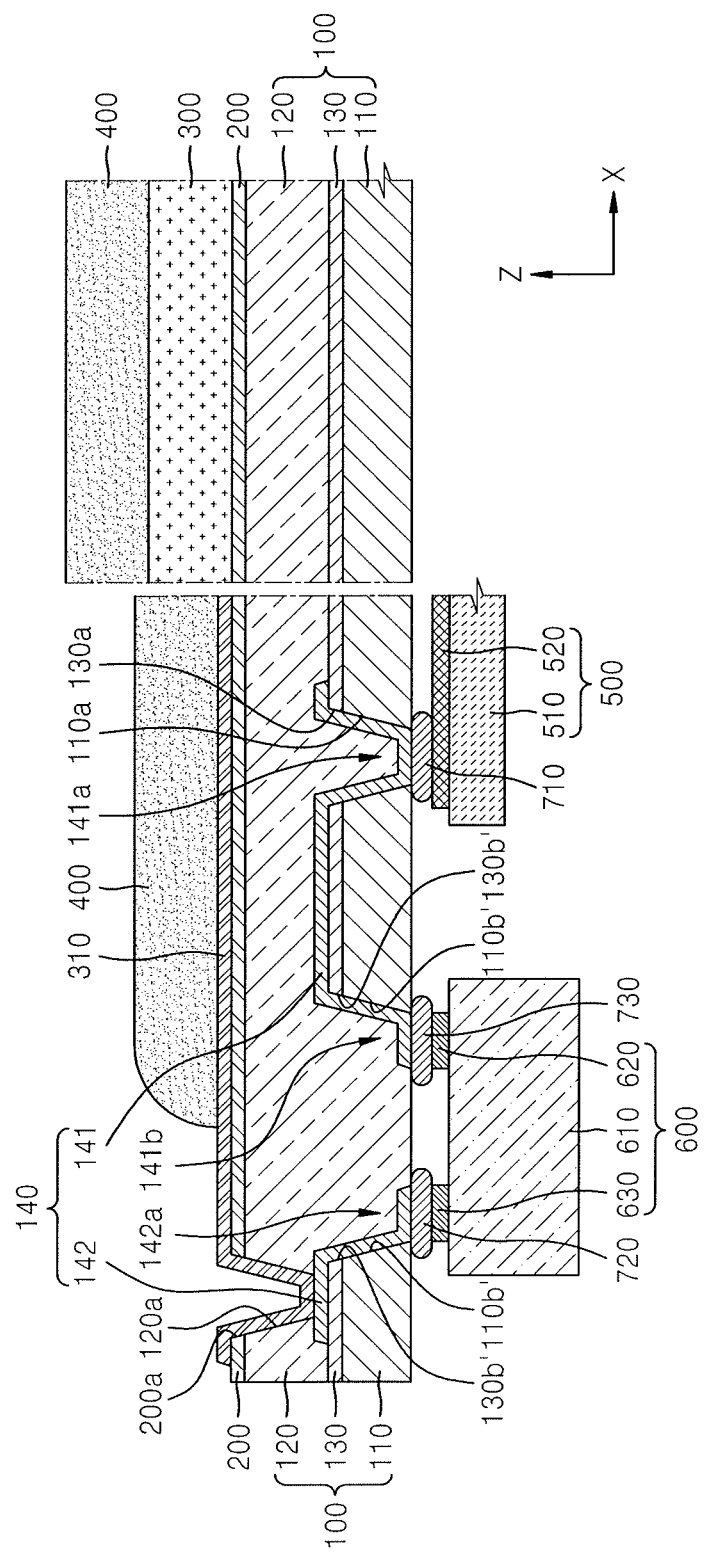
FIG. 15 illustrates a cross-sectional view of a portion of a display device according to another example embodiment.

The case where the first substrate layer 110 has the first through hole 110a, the second through hole 110b, and the third through hole 110c has been described so far. In another implementation, as shown in FIG. 15, which is a cross-sectional view schematically showing a portion of a display device according to another example embodiment, the first substrate layer 110 may have only the first through hole 110a and a second through hole 110b' as compared to the case of the display device according to the example embodiment described above with reference to FIG. 1. In this case, the barrier layer 130 on the first substrate layer 110 may also include the fifth through hole 130a and a sixth through hole 130b' respectively corresponding to the first through hole 110a and the second through hole 110b' of the first substrate layer 110.

The first intermediate conductive layer 141 between the barrier layer 130 and the second substrate layer 120 has the first exposed portion 141a and the second exposed portion 141b. The first exposed portion 141a is exposed to the outside of the first substrate layer 110 through the first through hole 110a and the second exposed portion 141b is exposed to the outside of the first substrate layer 110 through the second through hole 110b'. Here, the second exposed portion 141b may not completely fill the second through hole 110b' as shown in FIG. 15.

The second intermediate conductive layer 142 between the barrier layer 130 and the second substrate layer 120 has the third exposed portion 142a. The third exposed portion 142a is exposed to the outside of the first substrate layer 110 through the second through hole 110b'. The second intermediate conductive layer 142 is spaced apart from the first intermediate conductive layer 141. That is, the second exposed portion 141b of the first intermediate conductive layer 141 and the third exposed portion 142a of the second intermediate conductive layer 142 may both be located in the second through hole 110b'. A tip portion of the second exposed portion 141b in an edge direction (the −x direction) of the first substrate layer 110 is spaced apart from a tip portion of the third exposed portion 142a in a direction (a +x direction) of the second exposed portion 141b. Further, the second substrate layer 120 fills the second through hole 110b' of the first substrate layer 110 and at least a portion of the second substrate layer 120 is also exposed to the outside of the first substrate layer 110 in the second through hole 110b' of the first substrate layer 110.

Other configurations of the display device according to the present example embodiment are the same as and/or similar to those described in the above-described embodiment with reference to FIG. 1, and the related content may be applied.

Figure 16:
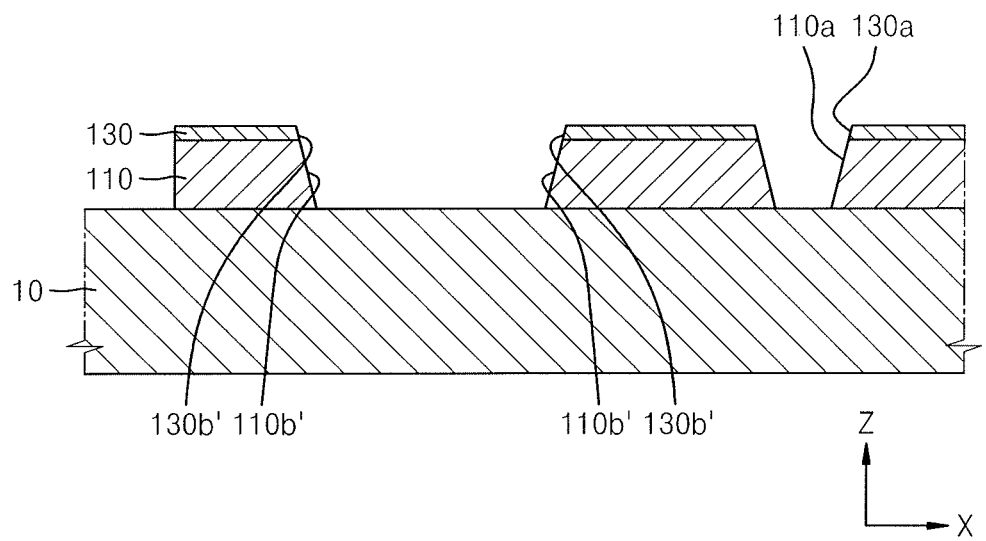
FIGS. 16 and 17 illustrate cross-sectional views of processes of manufacturing the display device of FIG. 15.
Figure 17:
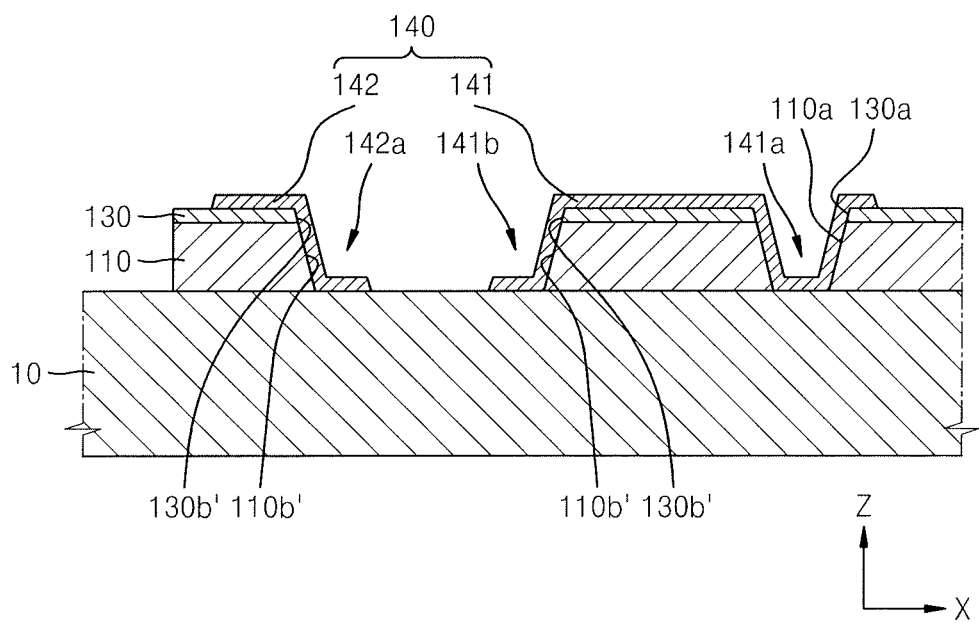

FIGS. 16 and 17 are cross-sectional views of processes of manufacturing the display device of FIG. 15. The first substrate layer 110 and the barrier layer 130 are formed above the carrier substrate 10 as described above with reference to FIG. 2. Then, as shown in FIG. 16, the first through hole 110a and the second through hole 110b' spaced apart from each other are formed in the first substrate layer 110. Since the barrier layer 130 is also formed on the first substrate layer 110, the fifth through hole 130a and the sixth through hole 130b' of the barrier layer 130 are also simultaneously formed when the first through hole 110a and the second through hole 110b' are formed in the first substrate layer 110. This process may be performed by applying a photoresist on the barrier layer 130, removing the photoresist only at a portion where the first through hole 110a and the second through hole 110b' are to be formed, and simultaneously etching the barrier layer 130 and the first substrate layer 110 by etching the portion of the barrier layer 130 not covered with the photoresist with an etchant. Accordingly, as shown in FIG. 17, an inner surface of the first through hole 110a and an inner surface of the fifth through hole 130a may form a continuous surface, and an inner surface of the second through hole 110b' and an inner surface of the sixth through hole 130b' may form a continuous surface.

Then, a conductive layer is coated on the barrier layer 130 and patterned to simultaneously form the first intermediate conductive layer 141 and the second intermediate conductive layer 142, which are spaced apart from each other as shown in FIG. 17. The patterning of the conductive layer may also be performed using a photoresist method. The first through hole 110a and the second through hole 110b' are formed in the first substrate layer 110, and the fifth through hole 130a and the sixth through hole 130b' are formed in the barrier layer 130. Therefore, the first intermediate conductive layer 141 has the first exposed portion 141a and the second exposed portion 141b which are in contact with the carrier substrate 10 in the first through hole 110a and the second through hole 110b', and the second intermediate conductive layer 142 also has the third exposed portion 142a which is in contact with the carrier substrate 10 in the second through hole 110b' Thereafter, the same and/or similar process as described above with reference to FIGS. 5 to 7 is performed to manufacture a display device as shown in FIG. 15. Therefore, also in a case of the display device according to the present example embodiment, a thickness of the second intermediate conductive layer 142 at a center of the fourth through hole 120a may be less than a thickness of the first intermediate conductive layer 141.

Figure 18:
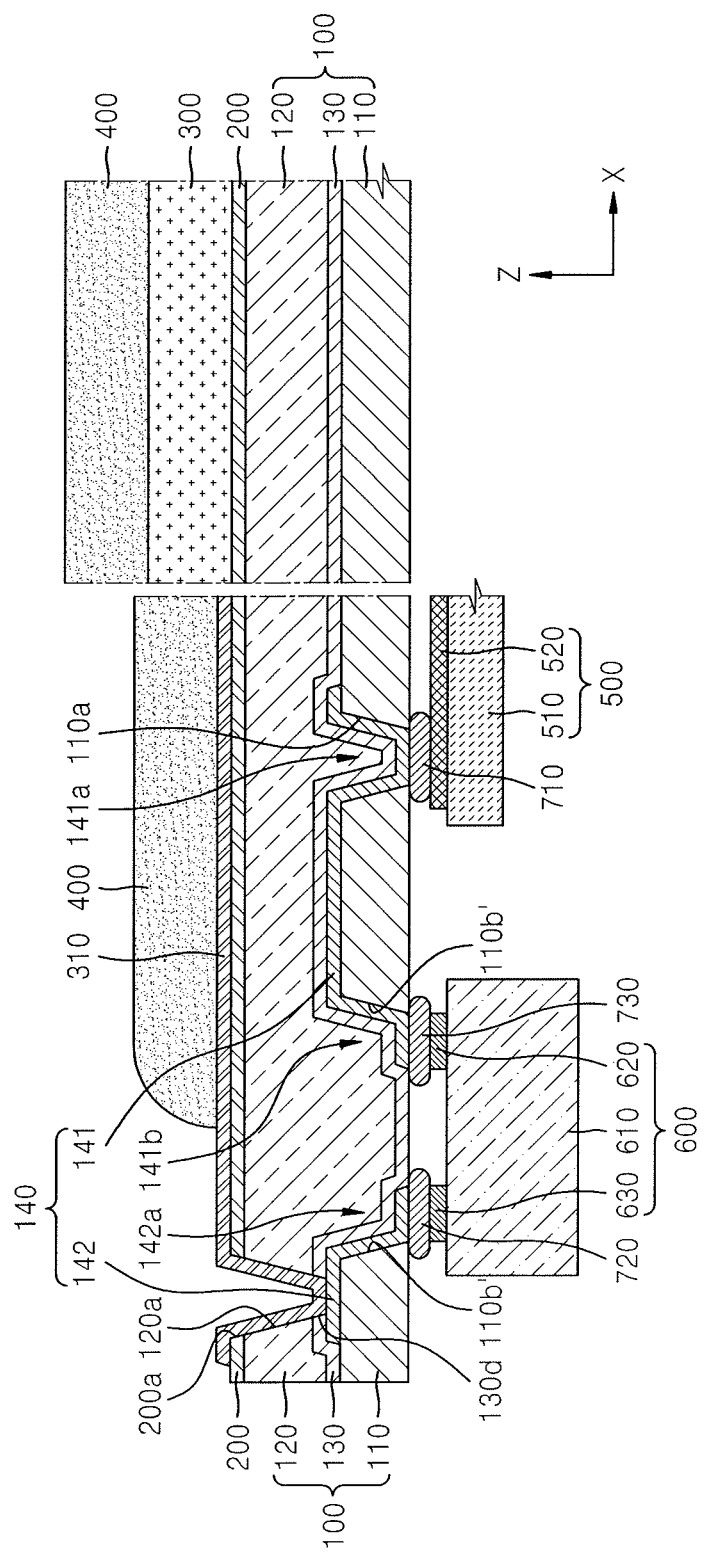
FIG. 18 illustrates a cross-sectional view of a portion of a display device according to another example embodiment.

FIG. 18 is a cross-sectional view of a portion of a display device according to another example embodiment. In the display device according to the present example embodiment, the first substrate layer 110 may have only the first through hole 110a and the second through hole 110b' as compared to the display device according to the example embodiment described above with reference to FIG. 1. The second through hole 110b' among the first through hole 110a and the second through hole 110b' is relatively adjacent to an edge (the −x direction) of the first substrate layer 110.

The first intermediate conductive layer 141 between the barrier layer 130 and the first substrate layer 110 still has the first exposed portion 141a and the second exposed portion 141b. The first exposed portion 141a is exposed to the outside of the first substrate layer 110 through the first through hole 110a and the second exposed portion 141b is exposed to the outside of the first substrate layer 110 through the second through hole 110b'. Here, the second exposed portion 141b may not completely fill the second through hole 110b' as shown in FIG. 18.

The second intermediate conductive layer 142 between the barrier layer 130 and the first substrate layer 110 still has the third exposed portion 142a. The third exposed portion 142a is also exposed to the outside of the first substrate layer 110 through the second through hole 110b'. The second intermediate conductive layer 142 is also spaced apart from the first intermediate conductive layer 141. That is, the second exposed portion 141b of the first intermediate conductive layer 141 and the third exposed portion 142a of the second intermediate conductive layer 142 may both be located in the second through hole 110b'. A tip portion of the second exposed portion 141b in an edge direction (the −x direction) of the first substrate layer 110 is spaced apart from a tip portion of the third exposed portion 142a in the direction (+x direction) of the second exposed portion 141b.

The barrier layer 130 covers the first intermediate conductive layer 141 and the second intermediate conductive layer 142. Accordingly, the barrier layer 130 fills the second through hole 110b' of the first substrate layer 110 and at least a portion of the second substrate layer 120 is also exposed to the outside of the first substrate layer 110 in the second through hole 110b' of the first substrate layer 110. The second substrate layer 120 may also fill the second through hole 110b' of the first substrate layer 110 above the barrier layer 130.

Other configurations of the display device according to the present example embodiment are the same as and/or similar to those described in the above-described embodiment with reference to FIG. 8, and the related content may be applied.

Figure 19:
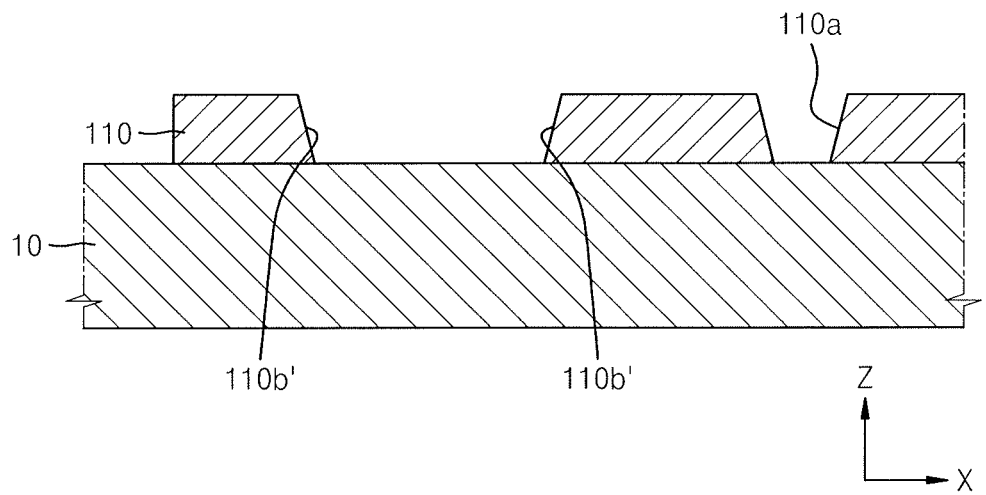
FIGS. 19 and 20 illustrate cross-sectional views of processes of manufacturing the display device of FIG. 18.
Figure 20:
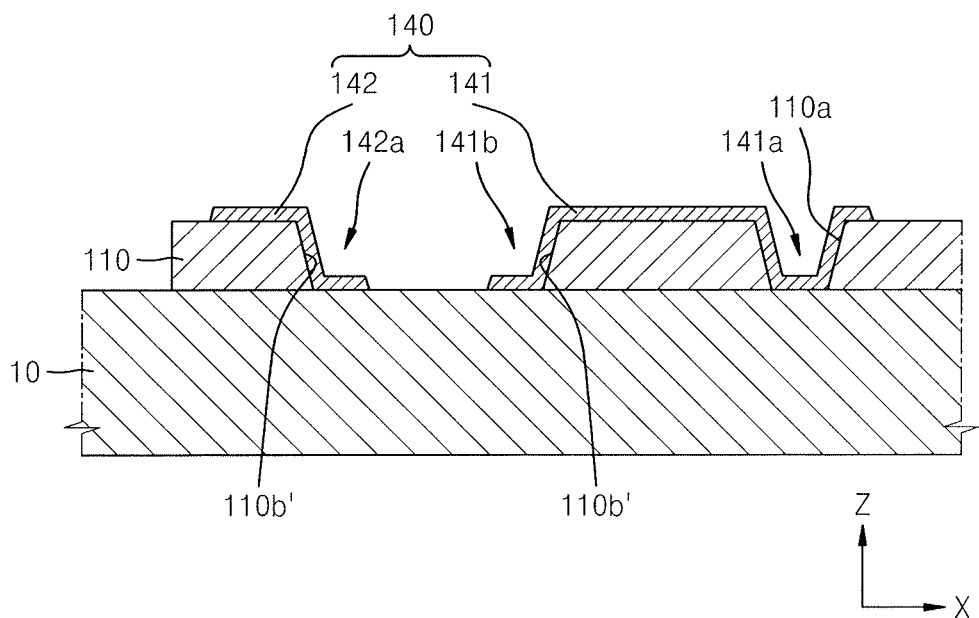

FIGS. 19 and 20 are cross-sectional views of processes of manufacturing the display device of FIG. 18. The first substrate layer 110 is formed above the carrier substrate 10 as described above with reference to FIG. 9. Then, as shown in FIG. 19, the first through hole 110a and the second through hole 110b' spaced apart from each other are formed in the first substrate layer 110. This process may be performed by applying a photoresist on the first substrate layer 110, removing the photoresist only at a portion where the first through hole 110a and the second through hole 110b are to be formed, and etching the portion of the first substrate layer 110 not covered with the photoresist with an etchant.

Then, referring to FIG. 20, a conductive layer is coated on the first substrate layer 110 and patterned to simultaneously form the first intermediate conductive layer 141 and the second intermediate conductive layer 142, which are spaced apart from each other. The patterning of the conductive layer may also be performed using a photoresist method. The first through hole 110a and the second through hole 110b are formed in the first substrate layer 110. Therefore, the first intermediate conductive layer 141 has the first exposed portion 141a and the second exposed portion 141b which are in contact with the carrier substrate 10 in the first through hole 110a and the second through hole 110b, and the second intermediate conductive layer 142 also has the third exposed portion 142a which is in contact with the carrier substrate 10 in the second through hole 110b'. Thereafter, the same and/or similar process as described above with reference to FIGS. 12 to 14 is performed to manufacture a display device as shown in FIG. 18. Therefore, also in a case of the display device according to the present example embodiment, a thickness of the second intermediate conductive layer 142 at a center of the fourth through hole 120a may be less than a thickness of the first intermediate conductive layer 141.

Figure 21:
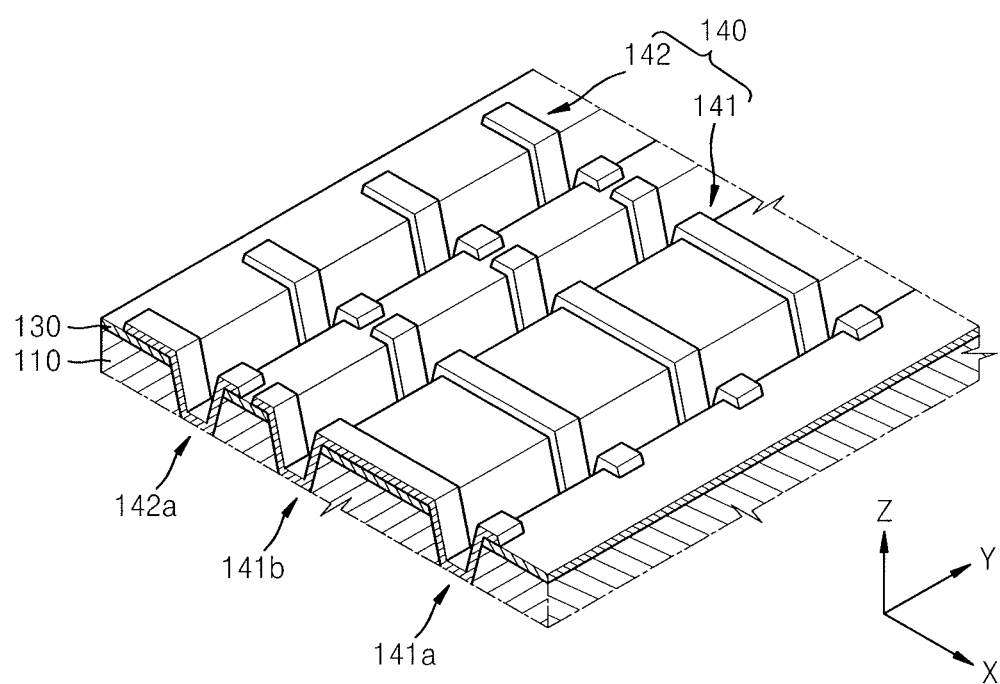
FIG. 21 illustrates a perspective view of a portion of the display device of FIG. 1.

Display devices according to various embodiments have been described so far with reference to the cross-sectional views of FIGS. 1 to 20. FIG. 21 is a perspective view of a portion of the display device of FIG. 1. As shown in FIG. 21, the display device may include a plurality of intermediate conductive layers 140 having the first intermediate conductive layer 141 and the second intermediate conductive layer 142. The intermediate conductive layers 140 may be approximately parallel to each other as shown in FIG. 21 and arranged in a y-axis direction. When the first electronic device 500, such as a printed circuit board, has a plurality of pads 520, a corresponding plurality of first intermediate conductive layers 141 may be used. Also, when the second electronic device 600, such as an integrated circuit, has a plurality of output pads 630, a corresponding plurality of second intermediate conductive layers 142 may be used. Although FIG. 21 schematically shows a portion of the display device of FIG. 1, the display devices according to the example embodiments described above with reference to FIGS. 8, 15 and 18 and display devices according to the modifications thereof may also have the plurality of intermediate conductive layers 140 approximately parallel to each other and arranged in the y-axis direction similar to those shown in FIG. 21.

By way of summation and review, a general display device may have a wide peripheral area outside a display area, that is, a wide dead space, because the display device includes a component for preparing and/or transmitting an electric signal to be applied to a display unit.

As described above, embodiments may provide a display device having a reduced dead space and for which manufacturing process is simplified, and a method of manufacturing the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display device, the method comprising:
preparing a carrier substrate;
forming a first substrate layer on the carrier substrate;
forming a first through hole, a second through hole, and a third through hole, which are sequentially arranged and spaced apart from each other, in the first substrate layer;
forming a first intermediate conductive layer having a first exposed portion exposed to the outside of the first substrate layer through the first through hole and a second exposed portion exposed to the outside of the first substrate layer through the second through hole, and a second intermediate conductive layer that is spaced apart from the first intermediate conductive layer and has a third exposed portion exposed to the outside of the first substrate layer through the third through hole, above the first substrate layer;
forming a second substrate layer on the first substrate layer to cover the first intermediate conductive layer and the second intermediate conductive layer;
forming a fourth through hole in the second substrate layer such that a portion of the second intermediate conductive layer below the second substrate layer is exposed;
forming a wiring on the second substrate layer so as to be electrically connected to the second intermediate conductive layer through the fourth through hole;
separating the first substrate layer from the carrier substrate;
arranging a first electronic device on a surface of the first substrate layer in a direction opposite the second substrate layer so as to be electrically connected to the first exposed portion; and
arranging a second electronic device on the surface of the first substrate layer in a direction opposite the second substrate layer so as to be electrically connected to the second exposed portion and the third exposed portion.

2. The method as claimed in claim 1, further comprising:
performing surface treatment on a region of the carrier substrate where the first exposed portion, the second exposed portion, and the third exposed portion are to be located, prior to the forming of the first substrate layer.

3. The method as claimed in claim 2, wherein the surface treatment includes a hydrophobic treatment.

4. A method of manufacturing a display device, the method comprising:
preparing a carrier substrate;

forming a first substrate layer on the carrier substrate;

forming a first through hole and a second through hole spaced apart from each other in the first substrate layer;

forming a first intermediate conductive layer having a first exposed portion exposed to the outside of the first substrate layer through the first through hole and a second exposed portion exposed to the outside of the first substrate layer through the second through hole, and a second intermediate conductive layer that is spaced apart from the first intermediate conductive layer and has a third exposed portion exposed to the outside of the first substrate layer through the second through hole, above the first substrate layer;

forming a second substrate layer on the first substrate layer to cover the first intermediate conductive layer and the second intermediate conductive layer;

forming a fourth through hole in the second substrate layer such that a portion of the second intermediate conductive layer below the second substrate layer is exposed;

forming a wiring on the second substrate layer so as to be electrically connected to the second intermediate conductive layer through the fourth through hole;

separating the first substrate layer from the carrier substrate;

arranging a first electronic device on a surface of the first substrate layer in a direction opposite the second substrate layer so as to be electrically connected to the first exposed portion; and arranging a second electronic device on the surface of the first substrate layer in a direction opposite the second substrate layer so as to be electrically connected to the second exposed portion and the third exposed portion.

5. The method as claimed in claim 4, further comprising:

performing surface treatment on a region of the carrier substrate where the first exposed portion, the second exposed portion, and the third exposed portion are to be located, prior to the forming of the first substrate layer.

6. The method as claimed in claim 5, wherein the surface treatment includes a hydrophobic treatment.

* * * * *